Nov. 3, 1970 J. R. HARFORD 3,538,448

GAIN CONTROLLED AMPLIFIER

Filed Jan. 17, 1968

INVENTOR

JACK R. HARFORD

BY Eugene M. Whitacre

ATTORNEY 3,538,448
GAIN CONTROLLED AMPLIFIER

Jack R. Harford, Three Bridges, N.J., assignor to RCA Corporation, a corporation of Delaware Filed Jan. 17, 1968, Ser. No. 698,505
Int. Cl. H03g 3/30
U.S. Cl. 330—29 6 Claims

ABSTRACT OF THE DISCLOSURE

A gain controlled transistor amplifier circuit provides an initial rapid gain reduction by increased emitter degeneration and a subsequent slower gain reduction by a combination of increased emitter degeneration and increased series attenuation of the applied signal.

This invention relates to transistor amplifier circuits, and more particularly gain control circuits for transistor amplifiers.

The invention as described herein may be embodied in either discrete circuit form or integrated circuit form, depending on the needs and desires of the user. The term integrated circuit, as used herein, refers to a unitary or monolithic semiconductor device or chip which is the equivalent of a network of interconnected active and passive circuit elements.

For the present purpose, reference will be made to specific component elements in an electric circuit; such reference will apply equally to the discrete circuit component form and to the structure which effectuates the similar function on an integrated circuit chip.

To be competitive with vacuum tube gain controlled amplifiers transistorized gain controlled amplifiers in either integrated circuit form or discrete circuit form must be capable of handling a comparable range of input signals. A basic problem exists, however, in that transistor amplifiers both in discrete component and integrated circuit form exhibit nonlinearity which leads to cross modulation and intermodulation distortion.

In the normal range of transistor operation, the transfer characteristic, that is the plot of collector current as a function of base-emitter voltage, is exponential, and, hence, the slope at any point along the transfer characteristic also exponential. As a result, when a signal is applied to base of a transistor there is a distortion in the output signal. Nevertheless, for small signals, the distortion is tolerable because small increments along the transfer characteristic approximate a linear plot and the distortion is not pronounced. But, as the input signal becomes larger, this approximation no longer holds true and greater amounts of distortion occur. Specific circuit applications determine what level of distortion is acceptable, and therefore, for a given transistor, the magnitude of input signal.

An amplifier embodying the present invention includes a transistor having a controllable emitter impedance network. Control means are connected to the impedance network for varying the gain of the amplifier to provide an initial rapid gain reduction of the amplifying means followed by a subsequent slower gain reduction when the amplifying means is gain reduced from an initial condition of maximum gain. In accordance with a feature of the invention, an attenuator network provides increasing attenuation of the signal applied to the amplifier during the slower gain reduction interval.

Figure 1:
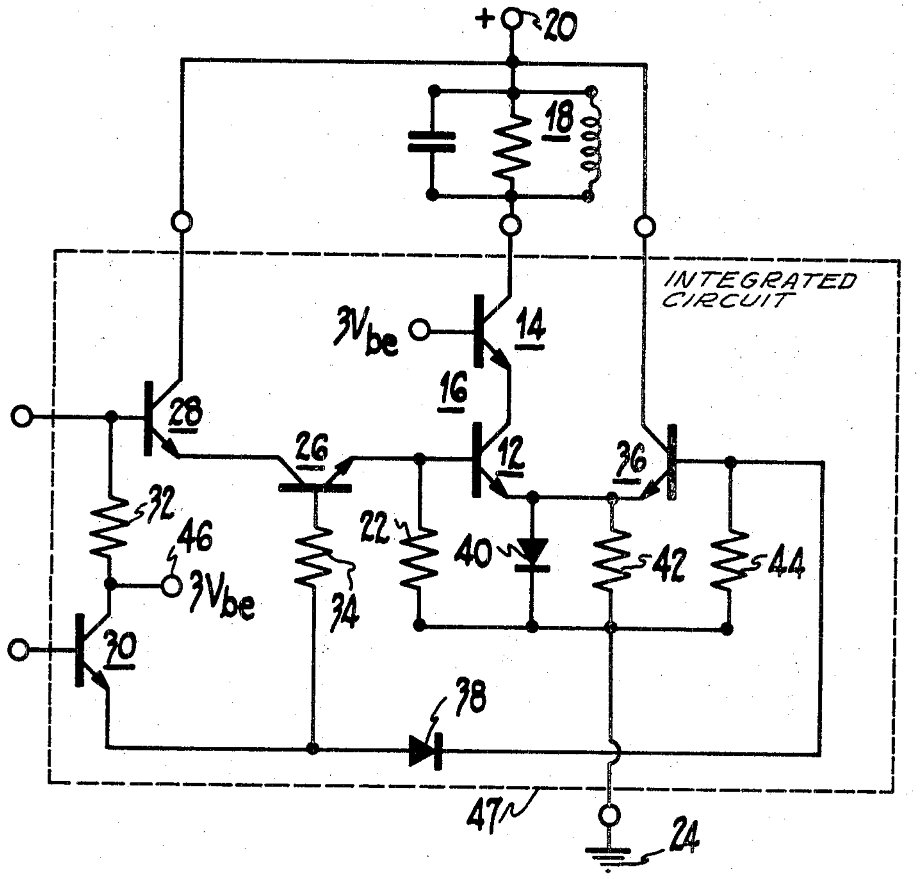
Figure 2:
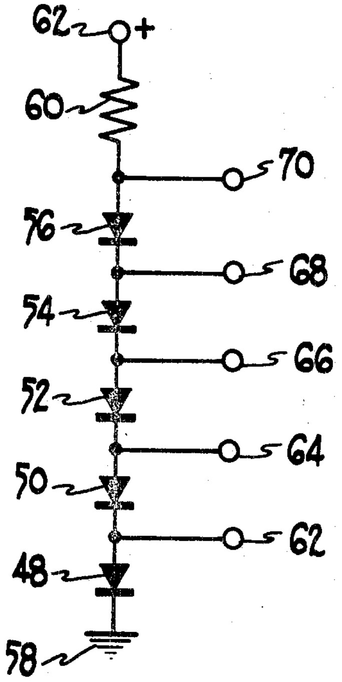

The novel features that are considered characteristic of this invention are set forth with particularity in the appended claims. The invention itself, however, both as to its organization and method of operation, will best be understood from the following description when read in connection with the accompanying drawing, in which:

FIG. 1 is a schematic circuit diagram of a gain controlled amplifier according to an embodiment of the invention; and FIG. 2 is a schematic circuit diagram of a multiple $V_{be}$ voltage supply.

Referring now to the drawings, and more particuarly to FIG. 1 which illustrates a gain controlled radio or intermediate frequency amplifier, two transistors 12 and 14 form a cascode amplifier 16. The cascode amplifier 16, which configuration provides relatively good isolation between the input and the output signal circuits, drives a tuned circuit 18. The collector electrode of the transistor 12 is directly connected to the emitter electrode of the transistor 14, and the collector electrode of the transistor 14 is connected to a terminal 20 by the tuned circuit 18. The terminal 20 is adapted to be energized by a positive source of potential, not shown. A bias of three $V_{be}$ is applied to the base electrode of the transistor 14 from a multiple $V_{be}$ supply. An explanation of a bias arrangement for the gain controlled amplifier will be given in greater detail hereinafter; however, the multiple $V_{be}$ voltage supply shown in FIG. 2 may be similar to a multiple supply disclosed in a patent application filed Sept. 14, 1964, in the name of Jack Avins, Ser. No. 396,140.

An input signal to the cascode amplifier 16 is applied at the base electrode of the transistor 12. A bias resistor 22 connects the base electrode of the transistor to the ground 24. A transistor 26 is connected with its collector and emitter electrodes in series with the base electrode of the transistor 12. The transistor 26 is adapted to provide gain control for the cascode amplifier 16 by attenuating the input signal to the amplifier and prevent signals which are so large as to result in an unacceptable amount of distortion from being applied to the cascode amplifier.

A transistor 28, connected as an emitter follower, receives at its base electrode the desired signal which is to be amplified by the cascode amplifier 16. The transistor 28 has its emitter electrode directly connected to the collector electrode of the transistor 26 and its collector electrode is directly connected to the terminal 20. The transistor 28 isolates the circuitry connected to its base electrode from impedance changes associated with the attenuator transistor 26.

A transistor 30 receives a gain control signal at its base electrode and provides the desired gain control information to the attenuator transistor 26 and to other gain control circuit components described hereafter. The gain control signal may be derived in a known manner as a function of signal strength as in radio or television receivers. The collector electrode of the transistor 30 is connected to the base electrode of the transistor 28 by a bias resistor 32. A resistor 34 interconnects the emitter electrode of the transistor 30 and the base electrode of the attenuator transistor 26. Gain control signals are, therefore, applied to the base of the attenuator transistor 26 from the emitter electrode of the transistor 30 through the resistor 34. The emitter electrode of the transistor 30 is connected to the base electrode of a transistor 36 by a diode 38. The diode 38 is a bias element utilized to achieve the proper $V_{be}$ bias on the transistor 36 and the diode 40.

The transistor 36 which forms part of the gain control circuitry for the cascode amplifier has its emitter electrode directly connected to the emitter electrode of the transistor 12. The junction of the emitters of the transistors 12 and 36 is connected to the ground 24 by a parallel combination of a diode 40 and a resistor 42. The diode 40 is so poled that when forward biased it provides a low impedance path from the emitter electrode of the transistor 12 to the ground 24. The collector electrode of the transistor 36 is directly connected to the terminal 20, and the base electrode of the transistor 36 is connected to the ground by a bias resistor 44.

To achieve proper biasing for the maximum gain condition of the circuit a three $V_{be}$ voltage is applied to the collector electrode of the transistor 30. The bias voltage is applied to a terminal 46 which is connected to the collector electrode of the transistor; for maximum gain, the gain control signal at the base electrode of the transistor 30 is of a value to cause the transistor to be saturated. For the cascode amplifier 16 to operate properly, with the three $V_{be}$ voltage applied to the base electrode of the transistor 14, as previously mentioned, the source of potential at terminal 20 must exceed three $V_{be}$. Under these conditions, a quiescent condition obtains with the circuit prepared to receive an input signal at the base electrode of the transistor 28 and a gain control signal at the base electrode of the transistor 30.

Under maximum gain conditions, the transistor 30 is in saturation and the voltage at its emitter electrode is the three $V_{be}$ applied at the terminal 46. Starting at the emitter electrode of the transistor 30 there are two loops to the ground 24, each providing a three $V_{be}$ drop. Thus, from the emitter electrode of the transistor 30 through the resistor 34, the base to emitter of the transistor 26, the base to emitter of the transistor 12 and the anode to cathode of the diode 40 is a drop of three $V_{be}$. It should be noted, of course, that the current flow in the base electrode of the transistor 26 is sufficiently small so that the voltage drop across the resistor 34 may be negelected. In a like manner, from the emitter electrode of the transistor 30 through the anode to cathode of the diode 38, the base to emitter of the transistor 36 and the anode to cathode of the diode 40 is a drop of three $V_{be}$.

Reference is now made to FIG. 2 which illustrates a multiple $V_{be}$ voltage supply. This $V_{be}$ supply is one form of multiple supply which may be used with the amplifier. The $V_{be}$ supply consists of a series of diodes 48, 50, 52, 54 and 56 connected in series between the ground 58 and one side of resistors 60. The other side of the resistor 60 is connected to a terminal 62 which is adapted to be energized by a source of potential, not shown. The resistor 60 limits the current flow through the diodes and prevents possible overload. Multiple output terminals 62, 64, 66, 68 and 70 are available. One terminal is connected at each diode anode. Thus, at the terminal 62 a voltage of one $V_{be}$ is available, at the terminal 64 two $V_{be}$, at the terminal 66 three $V_{be}$, etc. In this manner a multiple $V_{be}$ supply is obtainable. However, any voltage supply which provides the necessary bias voltages may, of course, be used.

Now referring again to FIG. 1, when the cascode amplifier 16 is at maximum gain, a gain control signal is applied to the base electrode of the transistor 30, which causes the transistor 30 to saturate and permit maximum current to flow through the collector-emitter circuit of the transistor 30 and into the base electrodes of the transistors 26 and 36. This saturates the attenuator transistor 26 and, in addition, operates the cascode amplifier at maximum gain. The attenuator transistor 26 during saturation has a low insertion loss, and the signal applied to the input of the cascode amplifier is unattenuated. Moreover, under condition of maximum gain, the voltage at the emitter electrode of the transistor 36 is sufficient to forward bias the diode 40 which provides a low impedance path for the emitter electrode of the transistor 12 to the ground 24. The cascode amplifier, therefore, is operating at maximum gain.

To reduce the gain of the system the gain control signal applied to the base electrode of the transistor 30 causes the current flow through the collector-emitter circuit to decrease. However, since the transistor 26 is in saturation, the initial effects of the change in gain control voltage are translated through the base-emitter paths of transistors 30 and 36 and diode 38 to the diode 40. These changes in voltage are in a direction to reduce the forward bias on the diode 40 which rapidly comes out of conduction. Consequently, impedance between the emitter electrode of the transistor 12 and the ground 24 increases rapidly and there is a rapid gain reduction of the cascode amplifier.

After the diode 40 comes out of conduction, the impedance looking into the emitter electrode of transistor 36 in association with the resistor 42 becomes the dominant impedance in the emitter electrode circuit of the transistor 12, and a situation where the cascode amplifier reduces all its gain before the attenuator becomes effective is avoided. As the control voltage applied to transistor 30 continues to change in a direction to reduce the gain of the system, the transistor 26 still being saturated, the emitter impedance of the transistor 36 increases providing a further more gradual reduction in gain of the cascode amplifier 16. This occurs because the impedance at the emitter electrode of the transistor 36 is proportional to the current through its emitter, and the current flow in the emitter electrode of the transistor 36 is determined by the resistor 42 and the voltage at its base electrode. The gain control signal, applied to the base electrode of the transistor 30 and translated to the resistor 42 through the transistor 30, the diode 38 and the transistor 36, thus, controls the gain of the cascode amplifier 16. The slower rate of the cascode amplifier gain reduction enables the attenuator transistor 26 to travel through its gain control range before the cascode amplifier has completely reduced its gain.

In the above manner, it can be seen that the cascode amplifier experiences an initial rapid gain reduction associated with the increased impedance caused by the diode 40 coming out of conduction, and a subsequent slower gain reduction associated with the impedance of the transistor 36 and the resistor 42. The slower gain reduction occurs in conjunction with an attenuation of the input signal to the cascode amplifier by the attenuator transistor 26.

The following figures represent the value of components used in the preferred embodiment of the present invention shown in FIG. 1:

| | | |
|---|---|---|
| Tuned circuit 18: | | |
| Capactor | pfd | 20 |
| Resistor | K | 1 |
| Inductor | μh | .6 |
| Resistor 22 | K | 1.5 |
| Resistor 32 | K | 2 |
| Resistor 34 | Ω | 300 |
| Resistor 42 | K | 1 |
| Resistor 44 | K | 2 |

The circuit components enclosed by the box 47 represent the components which would typically be disposed in an integrated circuit, should the gain controlled amplifier be fabricated in this form.

What is claimed is:

1. A transistor amplifier circuit comprising:
first and second transistors each having a base electrode, an emitter electrode and a collector electrode;
input circuit means including a third transistor having a base electrode, an emitter electrode and a collector electrode, the emitter and collector electrodes of said third transistor connected in series with the base electrode of said first transistor;
means including a voltage responsive impedance element connected in common between the emitter electrodes of said first and said second transistor and a point of reference potential;
means providing an adjustable gain control voltage coupled to the base electrode of said second transistor;
means including said gain control voltage providing means coupled to the base electrode of said third transistor to provide series attenuation of input signals; and
output circuit means coupled to the collector electrode of one of said first and said second transistors.

2. A transistor amplifier circuit comprising:
first and second transistor each having a base electrode, an emitter electrode and a collector electrode;
input circuit means coupled to the base electrode of said first transistor and including a third transistor having a base electrode, an emitter electrode and a collector electrode, the emitter and collector electrodes of said third transistor connected in series with the base electrode of said first transistor to provide series attenuation of input signals;
a unidirectional conductive device connected in common between the emitter electrodes of said first and said second transistor and a point of reference potential;
means providing a gain control voltage coupled to the base electrodes of said second and said third transistor;
output circuit means coupled to the collector electrode of one of said first and said second transistor.

3. A transistor amplifier circuit comprising:
first and second transistors each having a base electrode, an emitter elector and a collector electrode;
a unidirectional conductive device and a resistor connected in parallel interconnecting the emitter electrodes of said first and said second transistor to a point of reference potential;
input circuit means coupled to the base electrode of said first transistor and including a third transistor having a base electrode, an emitter electrode and a collector electrode, the emitter and collector electrodes of said third transistor connected in series with the base electrode of said first transistor;
a fourth transistor having a base electrode adapted to receive gain control information, an emitter electrode and a collector electrode, the emitter electrode of said fourth transistor coupled to the base electrode of said second and said third transistor to provide a gain control voltage to the base electrodes of said second and said third transistor, and the collector electrode of said fourth transistor coupled to said input circuit means; and
output circuit means coupled to the collector electrode of one of said first and said second transistor.

4. A transistor amplifier as defined in claim 3 wherein said first, second, third and fourth transistors, said unidirectional conductive device and said resistor are disposed in an integrated circuit.

5. A transistor amplifier circuit comprising:
first, second and third transistors each having a base electrode, an emitter electrode and a collector electrode, said first and said second transistor interconnected to form a cascode amplifier;
a unidirectional conductive device and a resistor connected in parallel interconnecting the emitter electrodes of said second and said third transistor to a point of reference potential;
input circuit means coupled to the base electrode of said second transistor and including a fourth and a fifth transistor each having a base electrode, an emitter electrode and a collector electrode, the emitter and collector electrodes of said fourth transistor and the emitter electrode of said fifth transistor connected in series with the base electrode of said second transistor;
a sixth transistor having a base electrode adapted to receive gain control information, an emitter electrode and a collector electrode, the collector electrode of said sixth transistor coupled to the base electrode of said fifth transistor, the emitter electrode of said sixth transistor connected to the base electrode of said fourth transistor by resistor means and to the base electrode of said third transistor by a second unidirectional conductive device; and
output circuit means coupled to the collector electrode of one of said first and said third transistor.

6. A transistor amplifier comprising:
a transistor cascode amplifier means having a signal input electrode and a signal output terminal;
a source of input signals to be amplified;
first means for coupling said source to said amplifier means input electrode, said means coupling said signals to said electrode substantially without attenuation over a first range of input signal amplitudes and further coupling said signals to said electrode with controlled attenuation for input signal amplitudes beyond said range to effectively limit signal excursions at said input electrode; and
second means coupled to said amplifier means to adjust the gain of said amplifier means when said first means couples said signals to said amplifier input electrode without attenuation and to additionally adjust the gain of said amplifier means when said first means couples said signals to said amplifier input electrode with attenuation.

References Cited

UNITED STATES PATENTS

| | | | |
|---|---|---|---|
| 3,447,094 | 5/1969 | Beres | 330—29 |
| 3,449,686 | 6/1969 | Bladen | 330—29 |
| 3,002,090 | 9/1961 | Hirsch | 330—29 X |

FOREIGN PATENTS 888,995 2/1962 Great Britain.

OTHER REFERENCES

Burke, "Differential Sense Switch," IBM Technical Disclosure Bulletin, vol. 9, No. 7, December 1966, p. 930.

ROY LAKE, Primary Examiner

J. B. MULLINS, Assistant Examiner

U.S. Cl. X.R.

330—30, 145